United States Patent
Sun et al.

(10) Patent No.: US 6,238,933 B1
(45) Date of Patent: May 29, 2001

(54) POLARIZATION METHOD FOR MINIMIZING THE EFFECTS OF HYDROGEN DAMAGE ON FERROELECTRIC THIN FILM CAPACITORS

(75) Inventors: Shan Sun; Steven D. Traynor, both of Colorado Springs, CO (US)

(73) Assignee: Ramtron International Corporation, Colorado Springs, CO (US)

( * ) Notice: Subject to any disclaimer, the term of this patent is extended or adjusted under 35 U.S.C. 154(b) by 0 days.

(21) Appl. No.: 09/305,949

(22) Filed: May 6, 1999

(51) Int. Cl.[7] .................................................. H01L 21/00
(52) U.S. Cl. .............................. 438/3; 438/11; 257/295
(58) Field of Search ................................ 438/3, 11, 15, 438/26, 210; 365/65, 145, 189, 230; 257/295, 308, 337, 296

(56) References Cited

U.S. PATENT DOCUMENTS

| | | | |
|---|---|---|---|
| 4,644,259 | 2/1987 | Boser | 324/51 |
| 5,043,622 | 8/1991 | Sagong et al. | 310/358 |
| 5,128,737 | * 7/1992 | Van Der Have | 357/40 |
| 5,146,299 | 9/1992 | Lampe et al. | 357/23.5 |
| 5,155,573 | 10/1992 | Abe et al. | 357/51 |
| 5,254,482 | 10/1993 | Fisch | 437/8 |
| 5,259,099 | 11/1993 | Banno et al. | 29/25.35 |
| 5,270,967 | 12/1993 | Moazzami et al. | 365/145 |
| 5,337,279 | 8/1994 | Gregory et al. | 365/201 |
| 5,525,528 | 6/1996 | Perino et al. | 437/7 |
| 5,661,730 | 8/1997 | Mitra et al. | 371/21.3 |
| 5,721,159 | 2/1998 | Nishimura et al. | 438/14 |
| 5,751,628 | 5/1998 | Hirano et al. | 365/145 |
| 5,800,683 | 9/1998 | Kammerdiner et al. | 204/192.12 |
| 6,051,858 | * 4/2000 | Uchida et al. | 257/295 |
| 6,115,281 | * 9/2000 | Aggarwat et al. | 365/145 |

OTHER PUBLICATIONS

*Piezoelectric Ceramics*, by Jaffe, Cooke, and Jaffe, published by the Academic Press © 1971.

Atkin, R.B., "Performance of Sputtered $Pb_{0.92}$ $Bi_{0.07}$ $La_{0.01}(Fe_{0.0405}Nb_{0.325}Zr_{0.27})O_3$ Ferroelectric Memory Films," Ferroelectrics 1972, vol. 3, pp. 213–215, Norwich, England.

Sharma, B.S., et al., "Retention in Thin Ferroelectric Films," Ferroelectrics 1973, vol. 5, pp. 69–75, Norwich, England.

Mehta, R.R., et al., "Depolarization Fields in Thin Ferroelectric Films," Journal of Applied Physics, vol. 44, No. 8, Aug. 1973, pp. 3379–3385, Woodbury, New York.

Shepherd, W.H., "Fatigue and Aging in Sol–Gel Derived PZT Thin Films," Materials Research Society Symposium Proceedings vol. 200, 1990, pp. 277–289, Pittsburgh, Pennsylvania.

Abt, N., "Electrical Measurement of Ferroelectric Capacitors for Non–Volatile Memory Applications," Materials Research Society Symposium Proceedings vol. 200, 1990, pp. 303–312, Pittsburgh, Pennsylvania.

(List continued on next page.)

Primary Examiner—David Nelms
Assistant Examiner—Phuc T. Dang
(74) Attorney, Agent, or Firm—Peter J. Meza, Esq.; Carol W. Burton, Esq.

(57) ABSTRACT

Ferroelectric switching properties are severely degraded in a hydrogen ambient atmosphere. By controlling the polarity of the capacitors in a ferroelectric memory during the manufacturing process, the amount of degradation can be significantly reduced. After metalization of a ferroelectric memory wafer, all of the ferroelectric capacitors are poled in the same direction. The polarization vector is in a direction that helps to counteract hydrogen damage. A hydrogen gas anneal is subsequently performed to control underlying CMOS structures while maintaining ferroelectric electrical properties. The wafer is then passivated and tested.

20 Claims, 8 Drawing Sheets

OTHER PUBLICATIONS

Kulkarni, J., et al., "Ageing of Volatile and Non–Volatile Components of the Remnant Polarization in PZT," Proceedings of the International Symposium on Integrated Ferroelectrics (1992), pp. 363–369, National Semiconductor Corp., Santa Clara, California.

Huffman, M., et al., "Morphology and Electrical Characterization of Calcium Modified Ferroelectric Lead Zirconate Titanate Films," Ferroelectrics, 1993, v. 143, n. 1/4, pp. 251–62, Norwich, England.

Dat, R., et al., "Imprint Testing of Ferroelectric Capacitors Used for Non–Volatile Memories," Integrated Ferroelectrics, 1994, vol. 5, pp. 275–286 Amsterdam B.V.

Evans, J.T. Jr., "The Imprint Mechanism in Ferroelectric Capacitors," Proceedings of the International Symposium on Integrated Ferroelectrics (1995), Radiant Technologies, Inc., Albuquerque, New Mexico.

"Fram Memory Products," Ramtron International Corporation, 1996.

Lee, J., et al., "Imprint of $(Pb,La)(Zr,Ti)O_3$ Thin Films With Various Crystalline Qualities," Applied Physics Letter, vol. 68, No. 4, Jan. 22, 1996, Woodbury, New York.

D. White, et al, "Optimization of Plastic Packaging of Ferroelectric Semiconductor Memories", presented at $10^{th}$ Anniversary International Symposium on Integrated Ferroelectrics, Monterey, California, Mar. 2, 1998.

E. Philofsky, Ph.D., et al, "A Qualitative Model for Degradation of FRAM® Products During Plastic Packaging", presented at $10^{th}$ Anniversary International Symposium on Integrated Ferroelectrics, Monterey, California, Mar. 2, 1998,.

* cited by examiner

PRIOR ART

FIG.9

PRIOR ART

FIG.10

PRIOR ART

POLARIZATION METHOD FOR MINIMIZING THE EFFECTS OF HYDROGEN DAMAGE ON FERROELECTRIC THIN FILM CAPACITORS

BACKGROUND OF THE INVENTION

This invention relates generally to ferroelectric memories. More particularly, the present invention relates to a polarization method for minimizing the adverse effects of hydrogen damage to the electrical properties of thin film ferroelectric capacitors and memories.

Ferroelectric materials are used in storage node capacitors due to their electrical properties of retention, read/write endurance, and speed of the write cycle. In a typical implementation, a ferroelectric capacitor "stack" includes a platinum or iridium bottom electrode, a ferroelectric dielectric layer, and a platinum or iridium top electrode. The ferroelectric capacitor stack is then inserted into a conventional CMOS process flow with some minor modifications of the masking layers.

Figure 9:
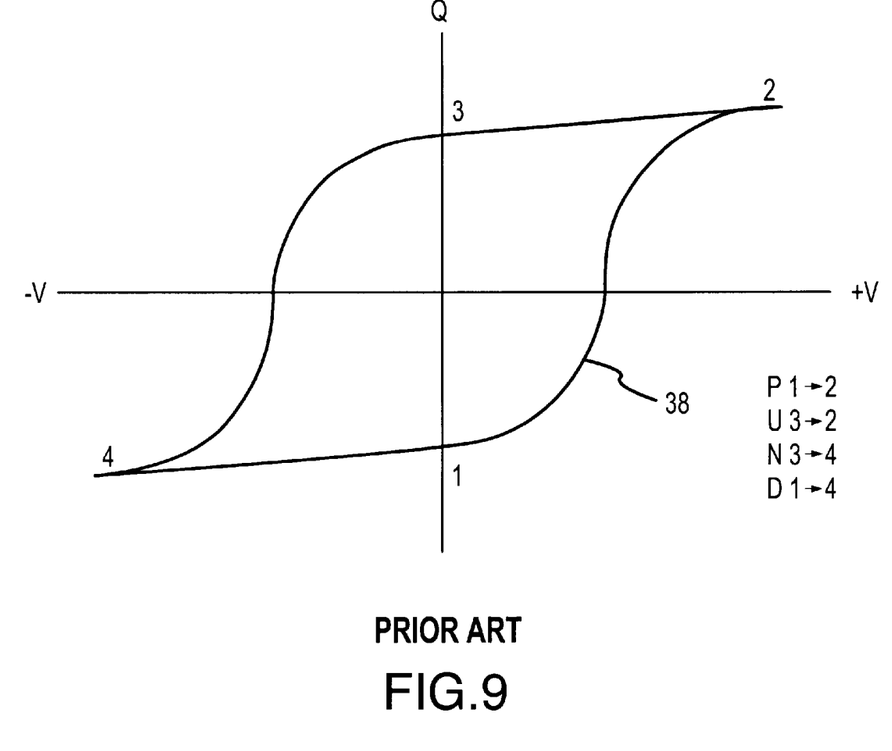
FIG. 9 is a hysteresis loop of a ferroelectric capacitor with corresponding operating points for defining certain charge components.

Referring now to FIG. 9 a hysteresis loop 38 is shown, which illustrates the electrical properties of a ferroelectric capacitor used in a Hysteresis loop 38 is centered about the origin of a charge (Q)—voltage (−V, +V) graph, wherein voltage is plotted along the X-axis, and charge is plotted along the Y-axis. A ferroelectric capacitor has two stable states that can be used for data storage. These are shown as operating points 1 and 3 on hysteresis loop 38. These points represent more or less permanent stable states inside the ferroelectric material that are retained after an externally applied electrical field is removed. The act of applying an external field to a ferroelectric material or capacitor is known in the art as "poling" and is described in the seminal text on ferroelectrics entitled "Piezoelectric Ceramics" by Jaffe, Cook, and Jaffe, published in 1971. On page 1 of the text, the authors state that "[t]oday we know that the polarity needed to impart piezoelectric properties can be given to an originally isotropic polycrystalline ceramic, more or less permanently, by temporary application of a strong electric field. This process, call 'poling', is analogous to the magnetizing of a permanent magnet."

Various charge components of hysteresis curve 38 have been identified in characterizing electrical performance of ferroelectric capacitors. A "P" charge component is defined as the charge associated with the application of an external positive voltage, and an excursion from operating point 1 to operating point 2 on hysteresis curve 38. A "U" charge component is defined as the charge associated with the application of an external positive voltage, and an excursion from operating point 3 to operating point 2 on hysteresis curve 38. An "N" charge component is defined as the charge associated with the application of an external negative voltage, and an excursion from operating point 3 to operating point 4 on hysteresis curve 38. A "D" charge component is defined as the charge associated with the application of an external negative voltage, and an excursion from operating point 1 to operating point 4 on hysteresis curve 38.

Figure 10:
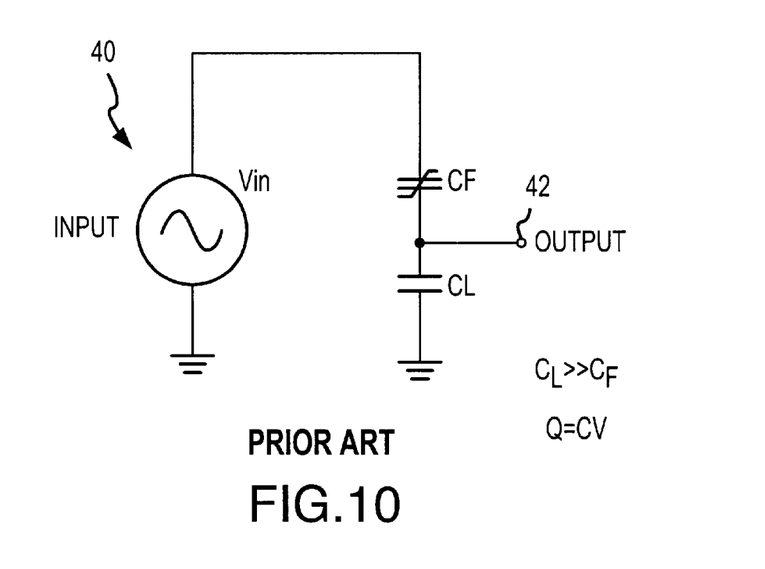
FIG. 10 is a circuit diagram of a "Sawyer-Tower" circuit used to characterize ferroelectric capacitors and to generate hysteresis curves.

Hysteresis curve 38 is generated using the "Sawyer-Tower" circuit 40 shown in FIG. 10. This circuit is well known in the ferroelectric art and is exceedingly simple in construction and operation. The basic components of this circuit are an input voltage or pulse generator, designated "Vin" in FIG. 10, a ferroelectric capacitor under test CF, a linear load capacitor CL, and an output pin 42. The output pin 42 is monitored by a voltmeter or oscilloscope [not shown in FIG. 10] as required. In order to make charge measurements and to generate a hysteresis curve, the capacitance of the load capacitor CL must be made much greater than the capacitance of the ferroelectric capacitor CF under test. In this way, most of the input voltage will be dropped across the capacitor under test The output voltage, however, can be related to the charge liberated by the ferroelectric capacitor under test using the well-known charge equation Q=CV, wherein "C" is equal to CL.

The operation of the "Sawyer-Tower" circuit and corresponding hysteresis loop is further explained at pages 37–38 of the Jaffe, Cook, and Jaffe text referred to above. "The commonly accepted criterion of ferroelectricity is a hysteresis loop on a D-E display. This is usually done with a cathode-ray oscillograph. [footnote omitted] Briefly, the method consists of applying an alternating voltage and relating the stored charge to the instantaneous voltage. [figure similar to FIG. 10 omitted] A large integrating capacitor is placed in series with the sample. The voltage across it measures the charge stored on the test sample and is conventionally displayed as the vertical deflection of an oscillograph. The applied voltage is displayed as the horizontal deflection."

For testing multiple capacitors, test circuit 40 can of course be used seriatim. Also, multiple load capacitors and output ports can also be used as desired. The basic technique for measuring the charge remains the same.

Figure 11:
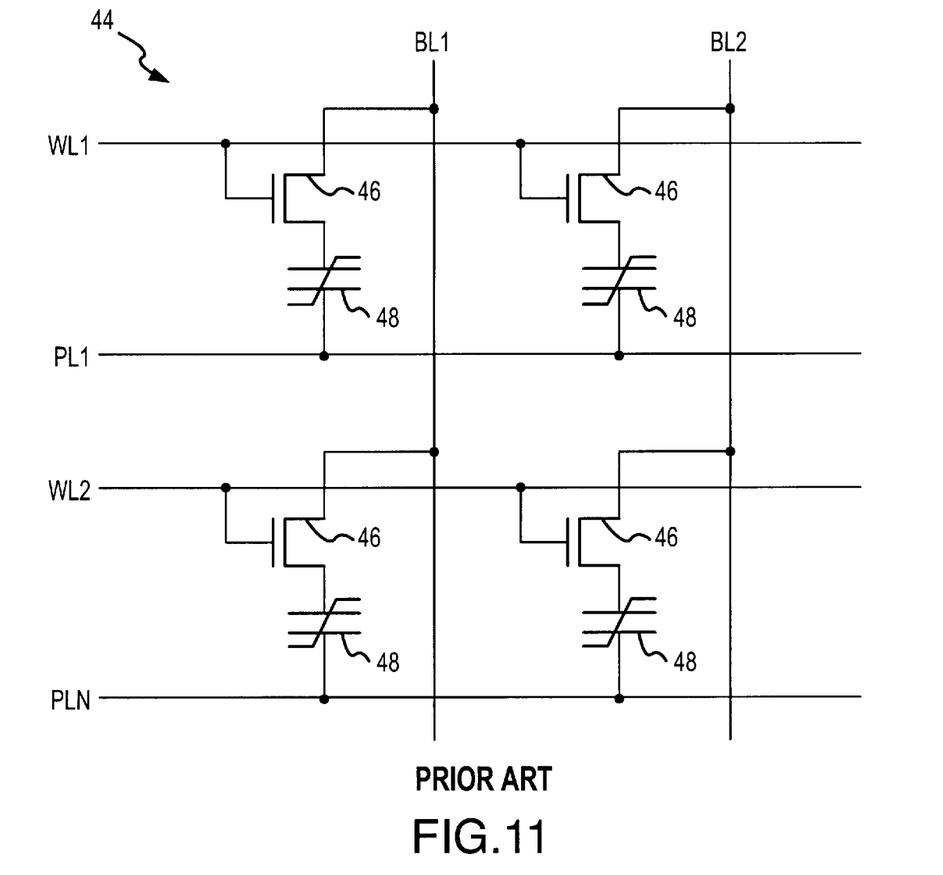
FIG. 11 is a circuit diagram of a 4×4 memory array of 1T/1C ferroelectric memory cells.

A portion of a one-transistor, one-capacitor ("1T/1C") ferroelectric memory array 44 is shown in FIG. 11. While only four individual memory cells are depicted, it is known by those skilled in the art that the array can be extended both in the number of columns and number of rows as required. Each 1T/1C memory cell includes a pass transistor 46 and an associated ferroelectric storage capacitor 48. Each row of memory cells includes a word line (WL1, WL2) coupled to the gate of each pass transistor 46, and a plate line (PL1, PL2) coupled to ferroelectric capacitors 48. Each column of memory cells includes a bit line (BL1, BL2) coupled to a source/drain of the each pass transistor 46, which is in turn coupled to a sense amplifier (not shown in FIG. 11). A reference cell is also coupled to the sense amplifier in a 1T/1C design, which can be simply another 1T/1C memory cell. To establish a reference level, the value of the capacitor in the cell is sometimes adjusted. More complicated circuits, however, can be used to establish a stable reference level.

The memory array 44 shown in FIG. 11 is manufactured in an integrated circuit including conventional CMOS circuitry. During the manufacturing process, the integrated circuit can be exposed to hydrogen from numerous sources. Hydrogen can attack the PZT material (lead zirconate titanate) that is typically used in integrated ferroelectric capacitors and degrade electrical performance. An otherwise desirable hydrogen-containing "forming gas" anneal, which is typically done on CMOS circuitry is usually omitted in the manufacture of ferroelectric memories to avoid "line degradation" or loss of electrical performance during manufacturing. Once the integrated circuit is manufactured and tested, further hydrogen exposure and electrical performance degradation is possible in the subsequent packaging process, especially if plastic packaging is used.

Perhaps the biggest challenge, therefore, is preventing the reduction of the oxide-based ferroelectric film during exposure to a hydrogen containing ambient and/or films during processing subsequent to the ferroelectric deposition.

What is desired, therefore, is a method compatible with existing ferroelectric memory manufacturing methods that will minimize hydrogen damage during both integrated circuit manufacture and packaging, and may even allow a forming gas anneal during integrated circuit manufacturing.

SUMMARY OF THE INVENTION

It is, therefore, a principal object of the present invention to prevent hydrogen damage during the manufacture of an integrated circuit ferroelectric memory.

It is another object of the invention to prevent hydrogen damage during the packaging of an integrated circuit ferroelectric memory.

It is an advantage of the invention that it allows the use of a forming gas anneal that is desirably used with CMOS integrated circuits, but is normally not used in conjunction with ferroelectric memories.

It is another advantage of the invention that the polarization method used does not significantly add to the cost or complexity of either the integrated circuit manufacturing process or packaging process of a ferroelectric memory.

According to the present invention a method of blanket polarization of the capacitors in the memory cers of a ferroelectric memory during both integrated circuit manufacturing and packaging in order to minimize hydrogen damage by minimizing the evolution of a destructive internal bias field is disclosed.

Electrical properties of metal/ferroelectric/metal capacitors can be severely degraded during integration in a hydrogen containing ambient. Ferroelectric capacitors were characterized using both Pt/PLZT/Pt and Pt/SBTN/Pt capacitors annealed in the temperature range of 50° C. to 200° C. using hysteresis and DC pulsing. The capacitors were stored in specific remanent states (negative, positive, and zero) by poling prior to annealing. The annealing was carried out in a forming gas ambient, containing 1% to 5% hydrogen and 99% to 95% nitrogen. The degradation is strongly dependent on the polarity of the remanent polarization. From the testing results, an empirical model of the formation of a fixed dipole layer at the top electrode-ferroelectric interface due to hydrogen degradation has been established, and it has been confirmed that the polarity of this dipole is positive.

The degradation of switching charge in a ferroelectric capacitor in response to a low temperature forming-gas anneal has therefore been characterized. The polarity of the remanent polarization during a hydrogen anneal or other hydrogen exposure determines the amount of degradation. Capacitors poled in the negative polarity exhibit the most degradation while capacitors poled in the positive polarity according to the present invention exhibit little to no degradation in remanent polarization. Virgin unpoled capacitors fall in-between the above two cases. The formation of an internal bias field during anneal is observed and, from the direction of shift along the polarization axis, the polarity of the charged species is deemed to be positive. Finally, a model is established in which, through platinum catalysis, the atomic hydrogen forms a hydrogen dipole at the top electrode /ferroelectric interface.

There appears to be two separate mechanisms associated with the degradation depending on the temperature. At temperatures above 150° C., a sufficient amount of hydrogen is driven into the film and the oxide undergoes reduction. Electrically this is observed as a decrease in the "remanent polarization", or charge that remains once the applied voltage is removed. At temperatures below 150° C. a small decrease in remanent polarization is observed in addition to the evolution of an internal bias field in the film.

The foregoing and other objects, features and advantages of the invention will become more readily apparent from the following detailed description of a preferred embodiment of the invention which proceeds with reference to the accompanying drawings.

DETAILED DESCRIPTION

Capacitors were formed on a 5000 Å thick oxide layer (BPSG) deposited on prime silicon monitor wafers. A bottom electrode of 200 Å titanium (Ti) and 1750 Å platinum (Pt) were sputter deposited followed by 2400 Å thick layer of lanthanum-doped lead zirconate titanate (PLZT). The PLZT film, which had a ratio 30/70 zirconium to titanium (Zr/Ti) was doped with 3% lanthanum (La). The PLZT layer was deposited by RF magnetron sputtering in an argon (Ar) ambient environment. The partially-formed capacitor stack was then subjected to an rapid thermal anneal (RTA) crystallization anneal in an oxygen ambient environment to form the perovskite phase. A 1750 Å platinum (Pt) top electrode was sputter deposited followed by photolithography and etching of the top electrode test structures. Processing was completed with a 650° C. furnace anneal in an oxygen ambient environment for one hour to recover the damage to the electrode interface during top electrode etching. Testing was carried out on $(50 \, \mu m)^2$ discrete capacitors.

Electrical measurements were performed using a standard Sawyer-Tower circuit 40 with a 4600 pF load capacitor CL as shown in FIG. 10. Input pulses were generated with an HP 8175A digital signal generator including the optional arbitrary waveform generator. Output waveforms were monitored by a Tektronix 2430A digital storage oscilloscope. Input waveforms were applied to the bottom electrode of the ferroelectric capacitor under test and the output waveforms were measured from the top electrode of the capacitor.

Figure 1A:
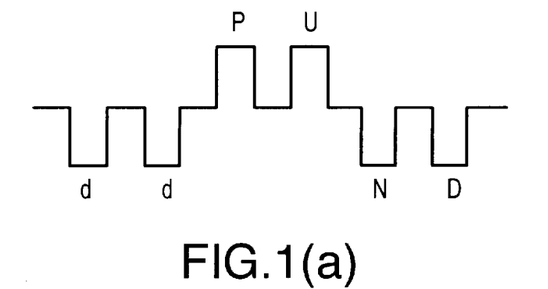
FIG. 1(a) is a ddPUND pulse sequence used to negatively pole ferroelectric capacitors.
Figure 1B:
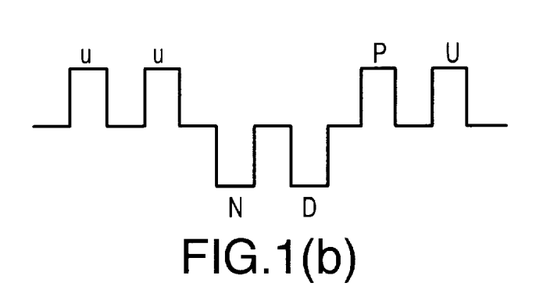
FIG. 1(b) is a uuNDPU pulse sequence used to positively pole ferroelectric capacitors.

FIG. 1(*a*) illustrates a ddPUND pulse sequence used to negatively pole ferroelectric capacitors, in which the pulse width is 1 $\mu s$ and pulse delay is 1 s. The ddPUND pulse sequence shown in FIG. 1(*a*) was applied to five virgin capacitors leaving them in the negative polarization state. The P, U, N, and D transitions are shown in FIG. 9 and defined above. The "d" transition is similar to the "D" transition defined above, but refers to pulses made on a virgin or not fully polarized ferroelectric capacitor. In a similar fashion, a uuNDPU pulse sequence, shown in FIG. 1(*b*), was applied to an additional five virgin capacitors, leaving them in the positive polarization state. The "u" transition is similar to the "U" transition defined above, but refers to pulses made on a virgin or not fully polarized ferroelectric capacitor. This sequence was repeated on groups of capacitors from two volts to seven volts in one-volt increments. In addition to the pulsing, hysteresis was measured on virgin capacitors in the same voltage range. Forming gas annealing was carried out in a MiniBrute furnace with low-temperature control capability. After annealing, four of the five capacitors were re-measured with the same pulse sequence as was applied prior to the anneal. The fifth capacitor of the negative and positive poled capacitors was used for hysteresis measurement.

The DC characterization results are given below.

Figure 2A:
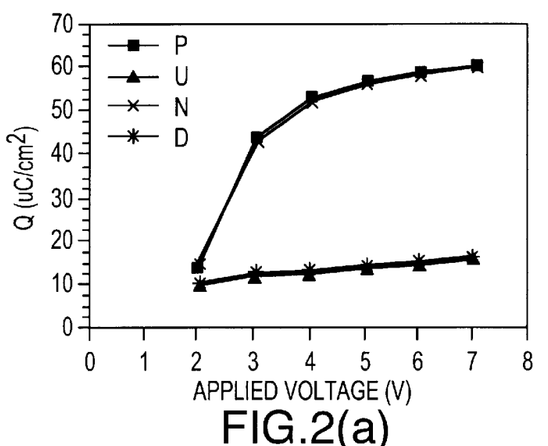
FIG. 2(a) is a charge versus voltage plot of virgin capacitors before annealing.
Figure 2B:
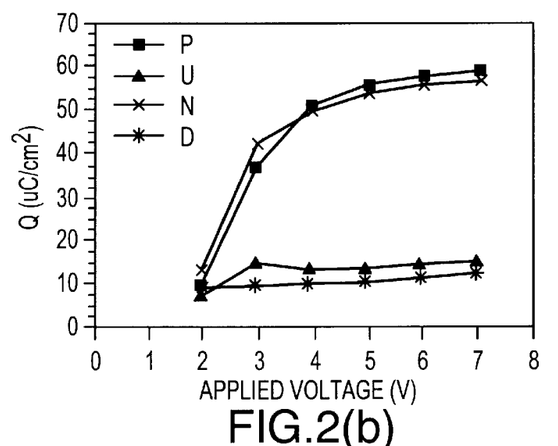
FIG. 2(b) is a charge versus voltage plot of the same capacitors after positive polarization and annealing.

FIG. 2(*a*) represents the virgin capacitors before a forming gas anneal that were subsequently left in the positive polarization state. FIG. 2(*b*) represents the measurements acquired on the same set of capacitors after anneal. The data at each voltage represents an average of four capacitors. Before anneal, the virgin capacitors exhibit low coercivity, a reasonably sharp rise to saturation, and remanent polarization of around 30 $\mu C/cm^2$ and 43 $\mu C/cm^2$ at ±3V and ±5V respectively. After annealing, the capacitors stored in the positive polarity showed only a slight degradation, most notably at low voltage.

Figure 3A:
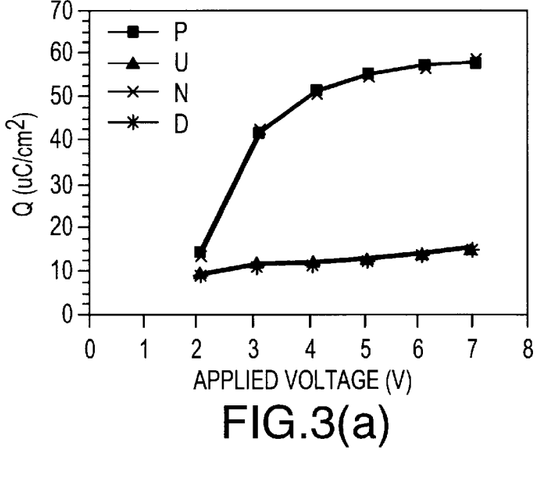
FIG. 3(a) is a charge versus voltage plot of virgin capacitors before annealing.
Figure 3B:
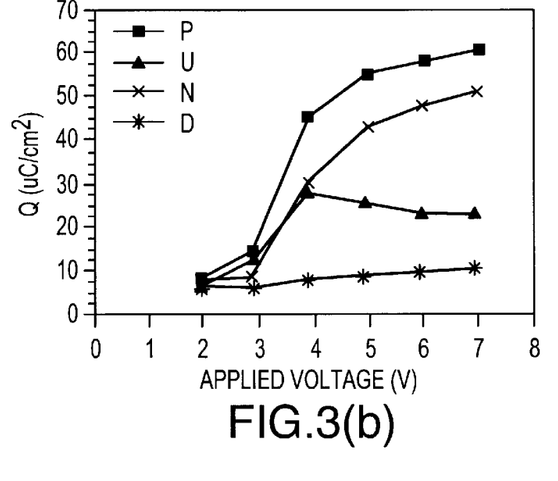
FIG. 3(b) is a charge versus voltage plot of the same capacitors after negative polarization and annealing.

FIGS. 3(*a*) and 3(*b*) show the results before and after forming gas annealing for the capacitors poled negative. The virgin capacitors before bake show characteristics similar to FIG. 2(*a*), as expected.

Figure 4:
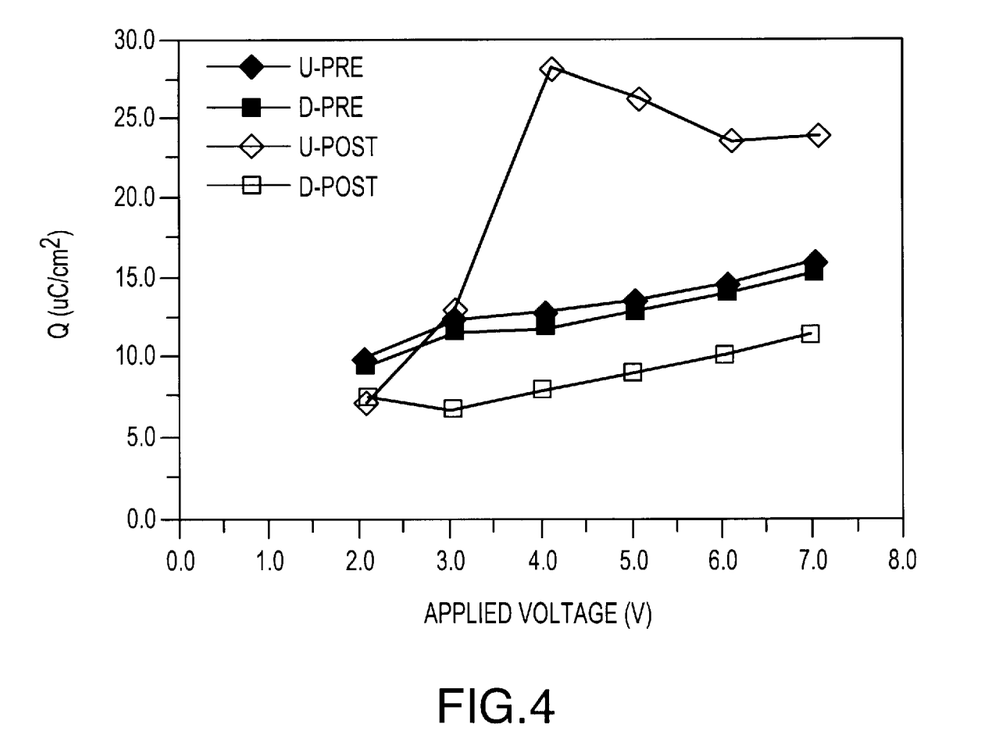
FIG. 4 is a charge versus voltage plot of positive and negative linear charge components before and after a forming gas anneal.

After annealing, the remanent polarization collapses at ±3 volts. Because we can eventually switch the domains at higher applied voltages, this implies that an internal bias field is formed that is preventing domain reversal at low voltage. At ±4 volts, the applied voltage is sufficiently large to reverse domains. However, the internal bias field causes significant depolarization. The depolarization increases the magnitude of the linear term by a factor of 2× as seen in FIG. 4. The fact that the positive linear term is affected implies that the polarity of the internal bias field is positive. The rationale is that the positive polarization state is now the preferred state due to the internal bias field. The domains are reversed with the application of an applied field but, upon removal of the field, the internal bias field forces depolarization back into the preferred state. As the applied voltage increases, asymmetry begins to decrease implying a redistribution of the internal bias field.

The AC characterization results are given below.

Figure 5A:
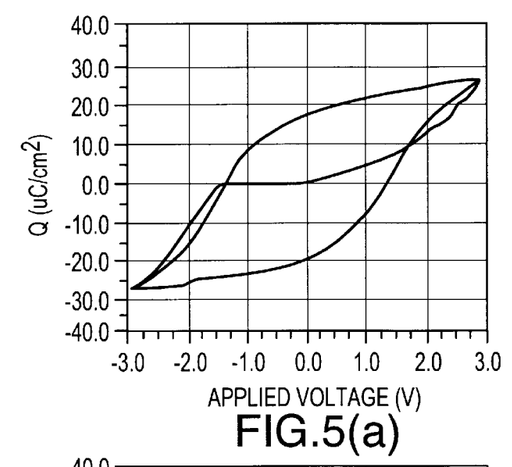
FIG. 5(a) is a hysteresis loop at ±3 volts corresponding to a virgin ferroelectric capacitor before anneal.
Figure 5B:
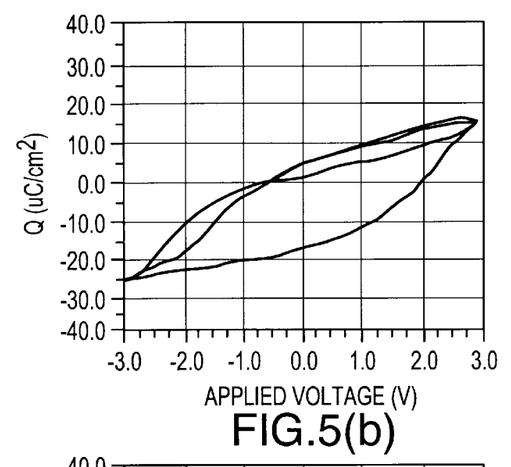
FIG. 5(b) is a hysteresis loop at ±3 volts corresponding to a virgin ferroelectric capacitor after anneal.
Figure 5C:
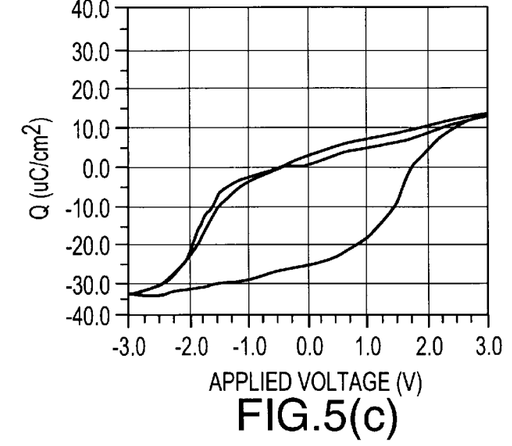
FIG. 5(c) is a hysteresis loop at ±3 volts corresponding to a ferroelectric capacitor that is positively poled and annealed.
Figure 5D:
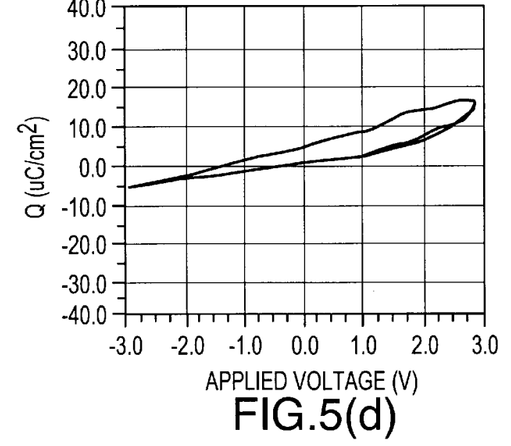
FIG. 5(d) is a hysteresis loop at ±3 volts corresponding to a ferroelectric capacitor that is negatively poled and annealed.

Hysteresis measurements were acquired with a single-shot, 10 kHz-sine wave with duration of 1.5 cycles. This allows for extraction of the polarization without extensive cycling, which may alter the results. Loops were taken at ±2 volts to ±7 volts in one-volt increments on virgin capacitors before and after anneal in addition to capacitors poled positive and negative through anneal. Detailed examination of the ±3 volt hysteresis is most informative in that, as in the DC characterization, there is sufficient polarization to work with, yet, after the anneal, the capacitors exhibit a strong polarity dependence. A virgin capacitor before anneal exhibits typical hysteresis properties i.e., symmetrical about the horizontal (voltage) and vertical (polarization) axes and the onset of saturation at around ±3 volts, as seen in FIG. 5(*a*). Also note that the starting point of the hysteresis is centered about the ±Pr (remanence polarization), y-axis crossing. This indicates that the initial distribution of domains is random. Thus, upon application of an applied voltage we expect to reverse 50% of the domains, the other 50% being already aligned in the positive direction.

FIG. 5(*b*) shows the loop of a virgin capacitor after exposure to hydrogen during anneal. The magnitude of the remanent polarization decreased by roughly 30% and the coercive voltage distribution has broadened, thus distorting the saturation characteristics. Most notable is that the initial polarization is no longer centered about the ±Pr values. This is a reaffirmation that a residual charge exists at the top electrode interface and, from the direction of shift, we can infer that the polarity of the residual charge is positive. The hysteresis measured on the capacitor poled positive during anneal is shown in FIG. 5(*c*). In this case the polarization has decreased by a few percent of the total and there appears to be a slight increase in the coercive voltage distribution. The y-axis shift indicates a positively poled capacitor, the same state in which it was stored before anneal. In general, the hysteresis compares favorably to that of a pre-anneal, virgin capacitor. The result of exposure to hydrogen under negative remanence is shown in FIG. 5(*d*). In this case, the remanent polarization is severely degraded in correlation with the DC results. It is believed that the loss is due to the pinning of domains from a charged species generated during the hydrogen anneal.

Figure 6A:
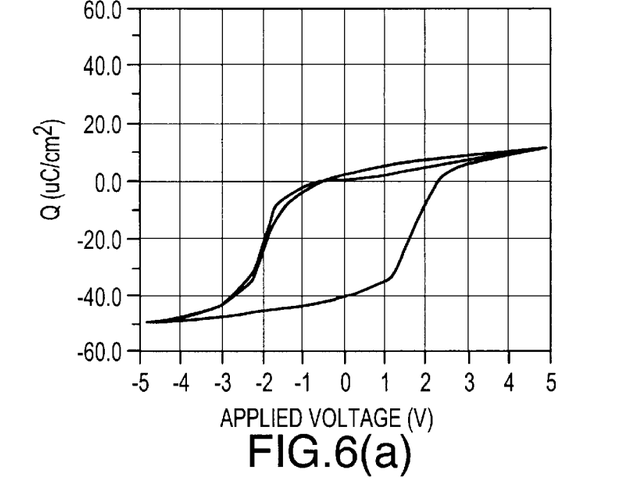
FIG. 6(a) is a hysteresis loop at ±5 volts for a ferroelectric capacitor stored positive during the hydrogen anneal.
Figure 6B:
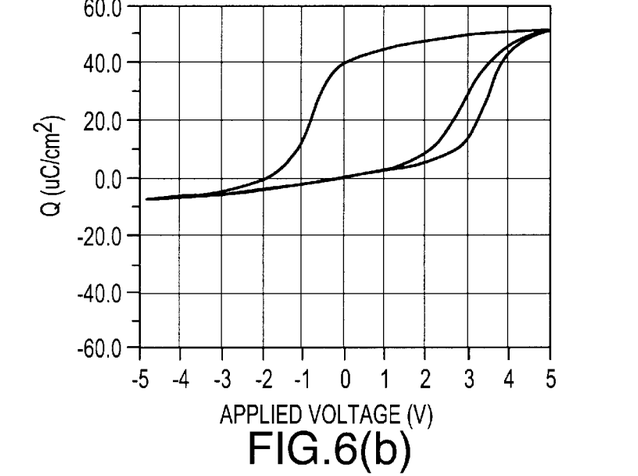
FIG. 6(b) is a hysteresis loop at ±5 volts for a ferroelectric capacitor stored negative during the hydrogen anneal.

At ±5 volts, the hysteresis loop still exhibits the characteristic shift associated with an internal bias field. For the capacitor annealed in the positive remanent polarity state, only a slight increase in asymmetry is observed, as seen in FIG. 6(*a*). Contrariwise, the capacitor poled negative before exposure to hydrogen annealing exhibits a significant shift along the voltage axis.

Figure 7:
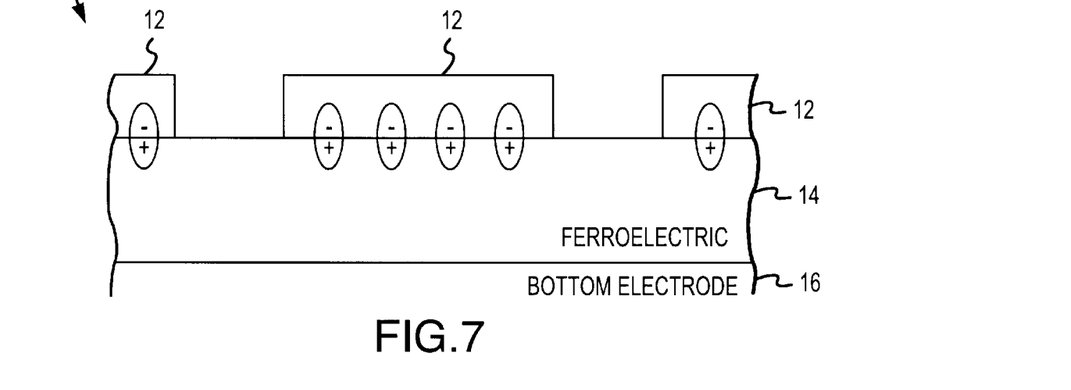
FIG. 7 is a cross-sectional diagram of a ferroelectric capacitor showing the formation of a hydrogen dipole layer at the top electrode interface as a result of exposure to a hydrogen anneal.

After exposure to hydrogen the physical characteristics of the platinum metal used in the ferroelectric capacitor electrodes change dramatically, going from a hard, brittle metal to one that is soft and pliable. The noble metals are known to absorb some 700 to 900 times their volume in hydrogen, which would explain the physical change. An empirical model for the degradation is presented as follows. Platinum is an extremely efficient catalyst for the conversion of adsorbed molecular hydrogen to atomic hydrogen. The atomic hydrogen is then free to move through the platinum metal to the platinum top electrode 12/ferroelectric layer 14 interface where it aligns itself as a hydrogen dipole across the interface, as illustrated in a section of a ferroelectric capacitor 10 shown in FIG. 7. If the net, remanent polarization of the ferroelectric is positive through anneal, the effect is to repel the formation of the hydrogen dipole layer and very little degradation to the switching properties are observed. When the net remanent polarization is negative, the polarization alignment acts to enhance the formation of the hydrogen dipole layer and severe degradation is observed.

Implementation of the polarization technique explained above may be applied in a number of scenarios from discrete capacitor level to integrated circuit devices.

On individual capacitors as used in piezoelectric and pyroelectric devices, a poling field can be applied to one electrode to drive the polarization into a given polarity. The polarity choice depends on whether one wants to repel the formation of a dipole layer thereby reducing or eliminating the degradation of switched charge or, if one wants to enhance the action of the dipole layer.

In the case of an integrated circuit incorporating ferroelectric capacitors the following method may be implemented. Beginning with a 1T/1C memory design (one transistor/one capacitor) the device would be processed through to the metalization sequence at which point the integrated circuit is fully operational. It is common to perform a forming gas anneal at this point to passivate dangling bonds at the Si/SiO2 interface to improve reliability of the CMOS transistors. The forming gas anneal is typically a mixture of hydrogen (1% to 5%) and nitrogen (99% to 95%) which acts as the carrier gas.

At this point, one would power up the device, which will give the user access to all the ferroelectric capacitors in the memory core. In a 1T/1C design, all cells would then be written in such a fashion so that the polarity of the polarization faces towards the top electrode, if this electrode is upper most in the circuit (i.e., positive polarization). After polarizing all of the ferroelectric storage elements, the device, or groups of devices at wafer level, are subjected to the forming gas anneal. After annealing, one would finish the process with application of a passivation film to protect the die through packaging.

A similar procedure can be used at package level. Plastic packaging in microelectronic fabrication involves the use of films that contain a large volume of hydrogen species, either as molecular hydrogen or as various molecules containing hydrogen. After application of these films during packaging, temperature excursions are needed to cure the films. It is during the temperature transitions that the hydrogen becomes mobile enough to interact with the underlying ferroelectric film. Poling the devices at wafer level, before the packaging process, will reduce or eliminate the subsequent interaction during the packaging process.

Figure 8:
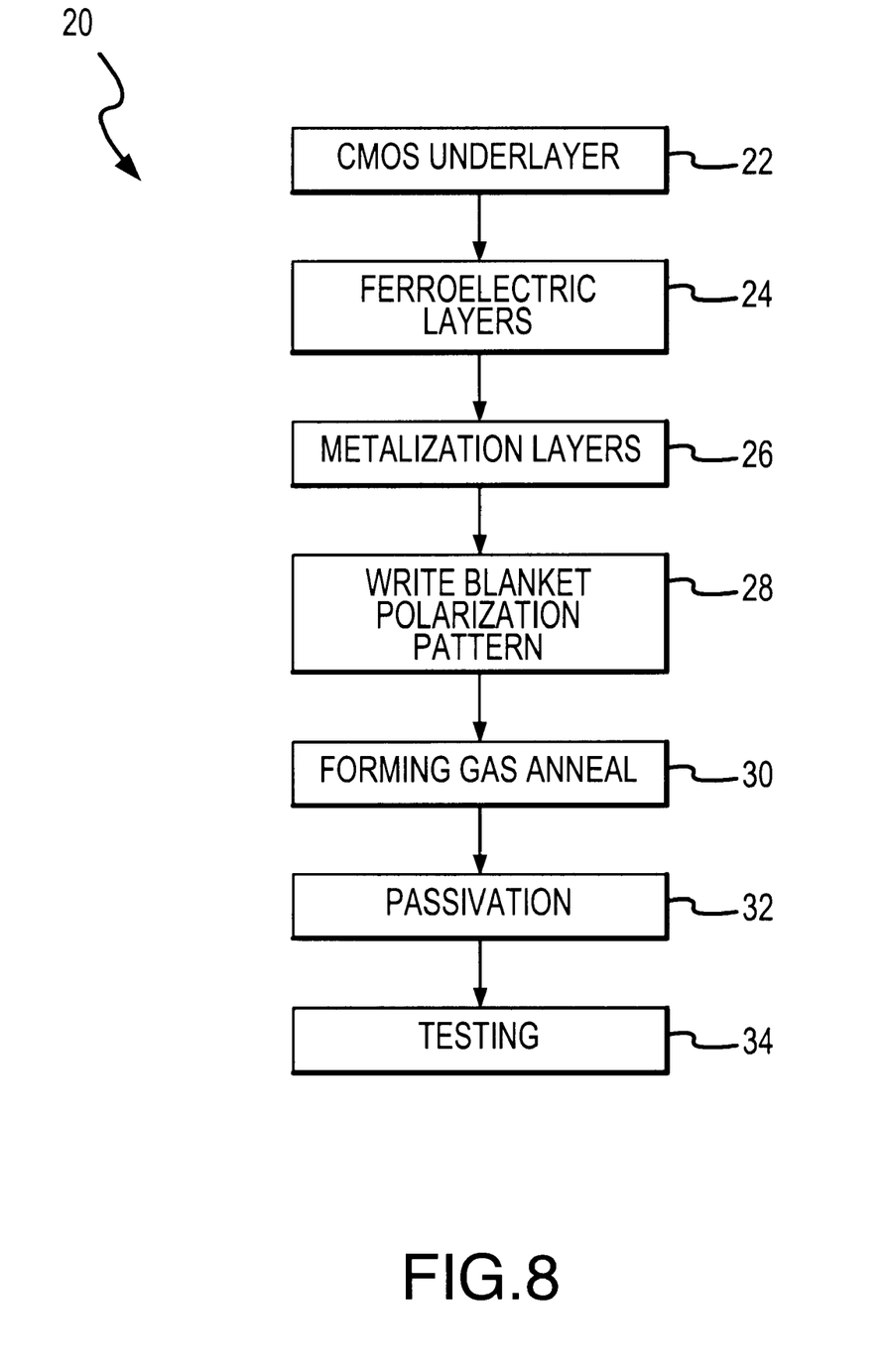
FIG. 8 is a flow chart of a method of fabricating an integrated circuit ferroelectric memory according to the present invention.

Referring now to FIG. 8, a flow chart 20 for a method of fabricating integrated circuit ferroelectric memories on a wafer so that damage due to hydrogen exposure can be minimized is shown, including the steps of: providing a CMOS underlayer wafer 22; forming and patterning ferroelectric and electrode layers on the surface of the wafer 24; forming and patterning metalization layers so that memory cells in the ferroelectric memory can be accessed 26; writing a blanket positive polarization pattern into all of the memory cells in the ferroelectric memory 28; performing a forming gas anneal 30; passivating the wafer 32; and testing each integrated circuit ferroelectric memory 34.

The blanket desirable positive polarization pattern is achieved by writing an appropriate pattern into each memory cell in the memory array of each ferroelectric memory die on the wafer. These patterns may vary with the memory circuit design used in order to provide the proper polarization as disclosed herein, and may vary from the uuNDPU pulse pattern disclosed above with respect to discrete capacitors.

The forming gas anneal, which is typically not used on ferroelectric memories because of the associated electrical performance degradation, is performed at a temperature range between about 50° C. and 200° C. Higher temperatures may be attempted up to 400° C., but these higher temperature anneals will cause increasing electrical performance damage. The forming gas anneal is performed in an ambient environment of between 1% and 5% hydrogen. The forming gas anneal is typically performed for about thirty minutes, with a range of between about fifteen and forty-five minutes.

The method described above and shown in flow chart 20 of FIG. 8 will provide protection against line degradation for memories in which the ferroelectric layer includes a PZT or PLZT ferroelectric layer, or an SBT (strontium bismuth tantalate) or SBTN (strontium bismuth tantalate niobate) ferroelectric layer.

Figure 12:
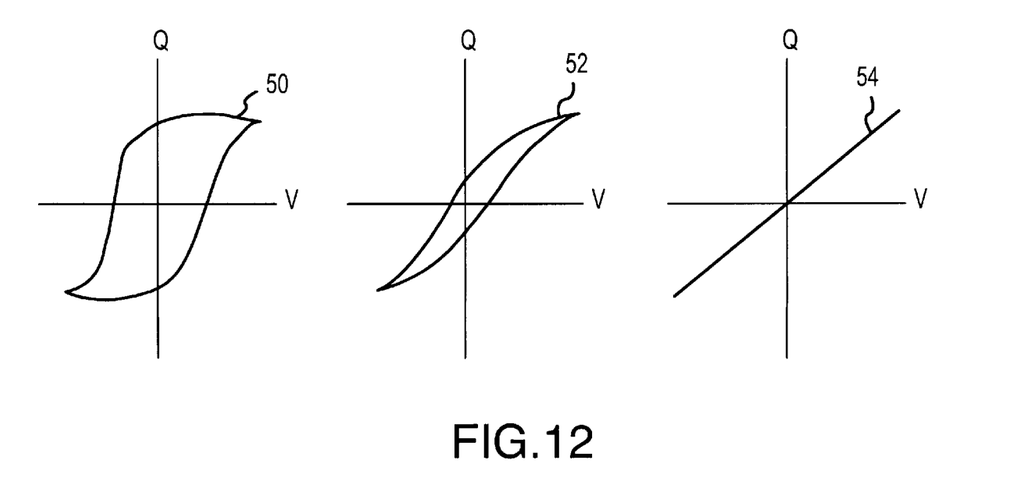
FIG. 12 is a series of three hysteresis loops corresponding to positively poled, virgin, and negatively poled ferroelectric capacitors exposed to a forming gas anneal or other hydrogen exposure.

Referring now to FIG. 12, three hysteresis loops are shown for a positively polarized ferroelectric capacitor 50, a virgin ferroelectric capacitor 52, and a negatively polarized ferroelectric capacitor 54, after exposure to hydrogen from a forming gas anneal, plastic packaging, or other source of hydrogen. These hysteresis loops illustrate the damage that may result to reference cell capacitors within the ferroelectric memory die that may or may not be correctly polarized to withstand hydrogen exposure. In a reference ferroelectric capacitor, the linear capacitance, and not the ferroelectric properties, is typically used to provide a stable reference level. Thus, an upolarized, or even negatively polarized ferroelectric reference capacitor will still maintain a linear capacitance term as shown that can be used to generate a reference level. If desired, circuitry can be included to write to the reference cells and achieve positive polarization. However, since this adds cost and circuit complexity and has limited benefits, the additional circuitry is probably not warranted.

Figure 13:
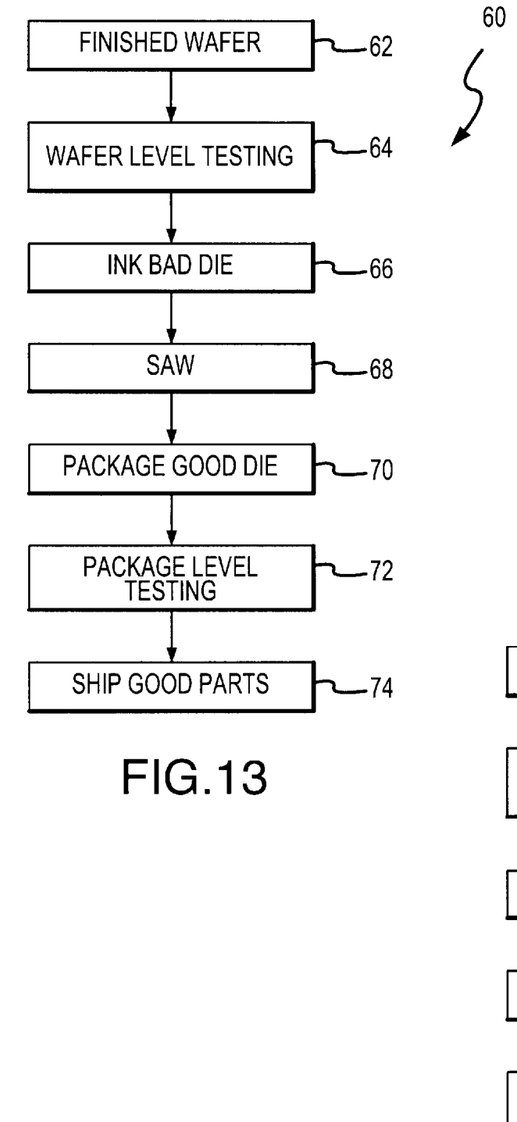
FIG. 13 is a flow chart of a first method of packaging a ferroelectric memory according to the present invention.

Turning now to FIG. 13 a flow chart 60 is shown for a method of packaging integrated circuit ferroelectric memories so that damage due to hydrogen exposure can be minimized, including the steps of: providing a fully fabricated ferroelectric memory wafer 62; testing all of the integrated circuit ferroelectric memories on the wafer to determine functional and non-functional memories 64, which includes writing a blanket positive polarization pattern into all of the memory cells in the functional ferroelectric memories; inking the non-functional memories 66; sawing the wafer 68 into individual memory dies; and packaging the functional memories 70. The package level-tested functional memories 72 are entered into inventory for shipping to customers at step 74.

The method shown in flow chart 60 of FIG. 13 helps to minimize performance degradation due to hydrogen exposure during plastic packaging. This method is suitable for new product introductions, where the yield is low and the cost of packaging non-functional die for later testing is not justified.

The method shown in flow chart 60 of FIG. 13 can be used on a fully fabricated ferroelectric memory wafer including PZT or PLZT-based ferroelectric memories, or SBT or SBTN-based ferroelectric memories.

The method shown in flow chart 60 of FIG. 13 achieves a blanket positive polarization pattern in all of the memory cells by writing an appropriate pattern as required by the memory design used, or by the writing of a uuNDPU pulse pattern into the memory, if possible.

Figure 14:
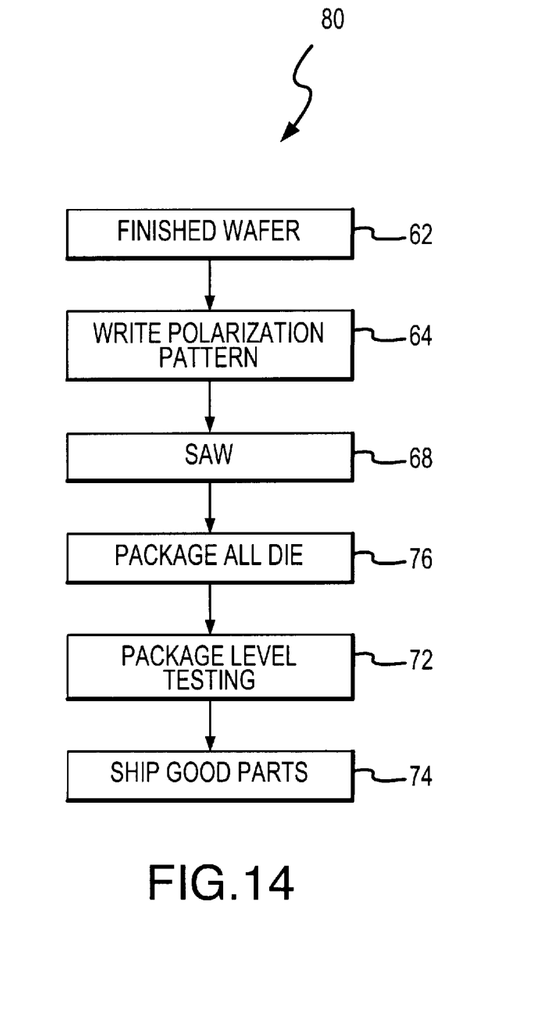
FIG. 14 is a flow chart of a second method of packaging a ferroelectric memory according to the present invention.

Referring now to FIG. 14, a flow chart 80 is shown for a second method of plastic packaging integrated circuit ferroelectric memories so that damage due to hydrogen exposure can be minimized, includes the steps of: providing a fully fabricated ferroelectric memory wafer 62; writing a blanket positive polarization pattern into all of the memory cells in all of the ferroelectric memories 64; sawing the wafer 68; and packaging all of the ferroelectric memories 76. The packaged parts are tested at step 72 and the functional parts are entered into inventory for shipping to customers at step 74.

The method of shown in flow chart 80 is more suitable for mature product families in which the yield is sufficiently high that the cost associated with packaging non-functioning parts is not prohibitive. The packaging method described above can be used on a fully fabricated ferroelectric memory wafer including either PZT or PLZT-based ferroelectric memories, or SBT or SBTN-based ferroelectric memories.

The blanket positive polarization pattern is achieved by writing an appropriate pattern as required by the memory design used, or by writing uuNDPU pulse pattern, if possible, into the memory array of each memory at step 64.

The packaging methods shown above in FIGS. 13 and 14 may be practiced apart from or in conjunction with the wafer-level fabrication method shown in FIG. 8 and described above.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

We claim:

1. A method of fabricating integrated circuit ferroelectric memories on a wafer so that damage due to hydrogen exposure can be minimized, comprising:
   providing a CMOS underlayer wafer;
   forming and patterning ferroelectric and electrode layers on the surface of the wafer;
   forming and patterning metalization layers so that memory cells in the ferroelectric memory can be accessed;
   writing a blanket positive polarization pattern into all of the memory cells in the ferroelectric memory;
   performing a forming gas anneal;
   passivating the wafer; and
   testing each integrated circuit ferroelectric memory.

2. The method of claim 1 in which writing a blanket positive polarization pattern comprises writing a uuNDPU pulse pattern.

3. The method of claim 1 in which the forming gas anneal is performed at a temperature range between about 50° C. and 200° C.

4. The method of claim 1 in which the forming gas anneal is performed in an ambient environment of between 1% and 5% hydrogen.

5. The method of claim 1 in which the forming gas anneal is performed for about fifteen to forty-five minutes.

6. The method of claim 1 in which forming the ferroelectric layer comprises forming a PZT or PLZT ferroelectric layer.

7. The method of claim 1 in which forming the ferroelectric layer comprises forming an SBT or SBTN ferroelectric layer.

8. A method of packaging integrated circuit ferroelectric memories so that damage due to hydrogen exposure can be minimized, comprising:
   providing a fully fabricated ferroelectric memory wafer;
   testing all of the integrated circuit ferroelectric memories on the wafer to determine functional and non-functional memories;
   writing a blanket positive polarization pattern into all of the memory cells in the functional ferroelectric memories;
   inking the non-functional memories;
   sawing the wafer;
   packaging the functional memories.

9. The method of claim 8 in which providing a fully fabricated ferroelectric memory wafer comprises providing a PZT or PLZT-based ferroelectric memory wafer.

10. The method of claim 8 in which providing a fully fabricated ferroelectric memory wafer comprises providing an SBT or SBTN-based ferroelectric memory wafer.

11. The method of claim 8 in which writing a blanket positive polarization pattern comprises writing a uuNDPU pulse pattern.

12. The method of claim 8 in which packaging the functional memories comprises plastic packaging the memories.

13. The method of claim 8 further comprising testing the packaged memories.

14. A method of packaging integrated circuit ferroelectric memories so that damage due to hydrogen exposure can be minimized, comprising:
   providing a fully fabricated ferroelectric memory wafer;
   writing a blanket positive polarization pattern into all of the memory cells in all of the ferroelectric memories;
   sawing the wafer;
   packaging all of the ferroelectric memories.

15. The method of claim 14 in which providing a fully fabricated ferroelectric memory wafer comprises providing a PZT or PLZT-based ferroelectric memory wafer.

16. The method of claim 14 in which providing a fully fabricated ferroelectric memory wafer comprises providing an SBT or SBTN-based ferroelectric memory wafer.

17. The method of claim 14 in which writing a blanket positive polarization pattern comprises writing a uuNDPU pulse pattern.

18. The method of claim 14 in which packaging the functional memories comprises plastic packaging the memories.

19. The method of claim 14 further comprising testing the packaged memories and discarding non-functional memories.

20. The method of claim 14 further comprising testing the packaged memories and shipping functional memories to a customer.

* * * * *